United States Patent
Nagai

(10) Patent No.: US 8,328,074 B2
(45) Date of Patent: Dec. 11, 2012

(54) COMPONENT-MOUNTED BOARD PRODUCTION APPARATUS AND POSITION CONTROL METHOD FOR ELECTRONIC COMPONENTS IN COMPONENT-MOUNTED BOARD PRODUCTION APPARATUS

(75) Inventor: Daisuke Nagai, Fukuoka (JP)

(73) Assignee: Panasonic Corporation, Osaka (JP)

( * ) Notice: Subject to any disclaimer, the term of this patent is extended or adjusted under 35 U.S.C. 154(b) by 16 days.

(21) Appl. No.: 12/441,015

(22) PCT Filed: Aug. 31, 2007

(86) PCT No.: PCT/JP2007/067448
§ 371 (c)(1),
(2), (4) Date: Mar. 12, 2009

(87) PCT Pub. No.: WO2008/032641
PCT Pub. Date: Mar. 20, 2008

(65) Prior Publication Data
US 2010/0001042 A1    Jan. 7, 2010

(30) Foreign Application Priority Data

Sep. 15, 2006  (JP) .................................. 2006-251066

(51) Int. Cl.
*B23K 1/00*  (2006.01)
*H05K 13/04*  (2006.01)
*H05K 3/34*  (2006.01)

(52) U.S. Cl. .................. 228/180.22; 228/103; 29/829; 29/840; 29/843

(58) Field of Classification Search .................. 228/102, 228/180.21, 103, 180.22; 29/829, 840, 843
See application file for complete search history.

(56) References Cited

U.S. PATENT DOCUMENTS 5,564,183 A * 10/1996 Satou et al. ...................... 29/840
5,862,973 A * 1/1999 Wasserman .................... 228/105

(Continued)

FOREIGN PATENT DOCUMENTS

CN    1350421 A    5/2002

(Continued)

OTHER PUBLICATIONS

International Search Report issued Dec. 18, 2007 in the International (PCT) Application of which the present application is the U.S. National Stage.
Written Opinion of the International Searching Authority issued Dec. 18, 2007 in the International (PCT) Application of which the present application is the U.S. National Stage.
Written Statement filed Jul. 10, 2008 in European Patent Office in reply to International Search Report.
International Preliminary Report on Patentability issued Dec. 30, 2008 in the International (PCT) Application of which the present application in the U.S. National Stage.

(Continued)

*Primary Examiner* — Devang R Patel
(74) *Attorney, Agent, or Firm* — Wenderoth, Lind & Ponack, L.L.P.

(57) ABSTRACT

The electronic component mounting line includes a computing unit for calculating a print position of solder paste printed on board-side electrodes, an electronic component placement device for placing an electronic component onto the board-side electrodes by referencing the print position of the solder paste, a placement position control device for controlling the placement position of the electronic component by referencing the print position of the solder paste, a bonding device for melting the solder paste to bond the electronic component and the board-side electrodes to each other, and a mounting-position control device for controlling the mounting position of the electronic component by referencing the board-side electrode position. In this configuration, position control responsive to displacement of the electronic component by the self alignment effect exerted by the molten solder paste is fulfilled.

2 Claims, 5 Drawing Sheets

U.S. PATENT DOCUMENTS

| | | | |
|---|---|---|---|
| 6,792,675 B2 * | 9/2004 | Tran | 29/760 |
| 6,983,538 B2 * | 1/2006 | Inoue et al. | 29/840 |
| 2001/0046723 A1 | 11/2001 | Hudson et al. | |
| 2002/0083570 A1 * | 7/2002 | Inoue et al. | 29/428 |
| 2004/0085701 A1 | 5/2004 | Inoue et al. | |

FOREIGN PATENT DOCUMENTS

| | | |
|---|---|---|
| JP | 6-185995 | 7/1994 |
| JP | 2002-084097 | 3/2002 |

OTHER PUBLICATIONS

Chinese Office Action issued Oct. 8, 2010 in corresponding Chinese Application No. 200780033667.X.

Chinese Office Action issued Dec. 21, 2011 in corresponding Chinese Application No. 2007800033667.X.

Chinese Office Action issued Dec. 21, 2011 in corresponding Chinese Application No. 200780033667.X.

\* cited by examiner

COMPONENT-MOUNTED BOARD PRODUCTION APPARATUS AND POSITION CONTROL METHOD FOR ELECTRONIC COMPONENTS IN COMPONENT-MOUNTED BOARD PRODUCTION APPARATUS

BACKGROUND OF THE INVENTION

I. Technical Field

The present invention relates to a component-mounted board production apparatus for mounting electronic components onto a board on which solder is placed on its board-side electrodes, as well as to a position control method for electronic components in the component-mounted board production apparatus.

II. Description of the Related Art

For mounting of electronic components onto a board such as a printed circuit board having electrodes formed on its top surface, a widely practiced method is that with solder paste preliminarily printed on the board-side electrodes and with component-side electrodes placed on the solder paste pieces, solder reflowing is performed so that the component-side electrodes will get wet with the molten solder to fulfill the bonding. The board-side electrodes and the component-side electrodes need to be accurately bonded to each other, respectively, with a view to ensuring the mounting quality. However, there are some cases where the solder paste printed on the board-side electrodes is offset in a print position with respect to the board-side electrodes or lack in printing uniformity. In such a case, when an electronic component is placed by referencing a design-base mounting reference position so that the both-side electrodes accurately overlap with each other, such failures can occur as a phenomenon that the electronic component is offset from an original placement position, i.e. the mounting reference position, due to surface tension by the reflowing molten solder, or that the electronic component is erected by strong surface tension acting partly thereon.

As a solution to such failures, there has been proposed an electronic component mounting apparatus which is so designed that a center of area (the center of area is a center of a planar surface) is determined from planar shapes of solder paste pieces printed on a pair of board-side electrodes and then an electronic component is placed by referencing the center of area (see Japanese unexamined patent publication No. 2002-84097). By placing an electronic component by referencing the center of area of solder paste pieces printed on a pair of board-side electrodes as shown above, it becomes possible that while the reflowing molten solder is wetted and spread on the surfaces of the board-side electrodes, component-side electrodes formed at both ends of the electronic component are moved to central portions of the individual board-side electrodes, respectively, by a self alignment effect exerted by the molten solder, thereby being automatically position-corrected roughly to the design-base mounting reference position.

SUMMARY OF THE INVENTION

In the field of electronic component mounting, there has been a demand for increasingly higher mounting quality in recent years. Ensuring such mounting quality requires performing inspections as to, for example, positional accuracy of the mounting on a basis of each step performed in the electronic component mounting line.

However, in a case where, for example, solder paste pieces are printed at positions offset from the board-side electrodes, there is displacement between a placement position of the electronic component before solder reflowing and a mounting position of the electronic component after the solder reflowing due to the self alignment effect of the molten solder. Therefore, the criterion by which the placement position of the electronic component before reflowing or the mounting position of the electronic component after reflowing is inspected is not clarified in the conventional electronic component mounting including Japanese patent publication No. 2002-84097 or the like. For example, under a condition that a board-side electrode position is adopted as the inspection criterion, there may be a case where an electronic component placed so as to be consistent with the print position of solder printed with an offset from the board-side electrode position is decided to have been offset in its placement position as an inspection result. Under another condition that the print position of solder that has been offset in its print position is adopted as an inspection criterion, there may be a case where an electronic component is decided to have been offset in its mounting position due to a placement of its mounting position caused by the self alignment effect of molten solder, as an inspection result. In such cases, position control of electronic components could not properly be fulfilled, making it difficult in some cases to ensure mounting quality of the electronic components.

Accordingly, an object of the present invention, lying in solving the above-described issues, is to provide a component-mounted board production apparatus prepared for displacements of electronic components due to the self alignment effect of molten solder as well as a position control method for electronic components in the component-mounted board production apparatus.

In accomplishing these and other objects, the present invention is constituted as follows.

According to a first aspect of the present invention, there is provided a component-mounted board production apparatus for sequentially performing a plurality of processes by which an electronic component having a plurality of component-side electrodes is mounted via solder onto a board having a plurality of board-side electrodes, the apparatus comprising:

a solder set-position measuring device for measuring a set position of the solder supplied onto each of the board-side electrodes;

an electronic component placement device for placing the electronic component onto the board-side electrodes by referencing the set position of the solder measured by the solder set-position measuring device;

a placement-position decision device for, by referencing the set position of the solder, making a decision as to conformity or nonconformity of a placement position of the electronic component obtained by the electronic component placement device;

a bonding device for melting the solder to bond the component-side electrodes of the electronic component and the board-side electrodes of the board to each other so that the electronic component is mounted on the board; and a mounting-position decision device for, by referencing the board-side electrode position, making a decision as to conformity or nonconformity of a mounting position of the electronic component obtained by the bonding device.

According to a second aspect of the present invention, there is provided the component-mounted board production apparatus as defined in the first aspect, wherein the solder set-position measuring device comprises:

a volume distribution measuring unit for measuring a volume distribution of the solder set on the respective board-side electrodes; and computing unit for calculating a center of volume of the solder based on the volume distribution measured by the volume distribution measuring unit to calculate a position of the center of volume along a surface of the board as the set position of the solder.

According to a third aspect of the present invention, there is provided a position control method for electronic components in a component-mounted board production apparatus for sequentially performing a plurality of processes by which an electronic component having a plurality of component-side electrodes is mounted via solder onto a board having a plurality of board-side electrodes, the method comprising:

measuring a set position of the solder supplied onto the plurality of board-side electrodes;

placing the electronic component onto the plurality of board-side electrodes by referencing the measured set position of the solder;

making a decision as to conformity or nonconformity of a placement position of the electronic component by referencing the set position of the solder;

with the board decided as a conforming article, melting the solder to bond the component-side electrodes of the electronic component and the board-side electrodes of the board to each other so that the electronic component is mounted on the board; and by referencing the board-side electrode position, making a decision as to conformity or nonconformity of a mounting position of the electronic component obtained by the bonding device.

According to a fourth aspect of the present invention, there is provided the position control method for electronic components in the component-mounted board production apparatus as defined in the third aspect, wherein the measurement of a set position of the solder is carried out by:

measuring a volume distribution of the solder set on the respective board-side electrodes; and thereafter, calculating a center of volume of the solder based on the measured volume distribution to calculate a position of the center of volume along a surface of the board as a set position of the solder.

According to a fifth aspect of the present invention, there is provided the position control method for electronic components in the component-mounted board production apparatus as defined in the third aspect, wherein the board that has been decided as a nonconforming article as a result of the conformity/nonconformity decision on the placement position of the electronic component by referencing the set position of the solder is removed from the component-mounted board production apparatus without being subjected to succeeding processes.

According to the present invention, a decision as to conformity or nonconformity of a placement position of an electronic component placed on board-side electrodes, i.e. a placement position of the electronic component in a state before the melting of solder, is made by referencing a placement position of the solder printed on the board-side electrodes. Further, a decision as to conformity or nonconformity of a mounting position of the electronic component bonded to the board-side electrodes, i.e. a mounting position of the electronic component in a state after the melting of the solder, is made by referencing the board-side electrode position. Therefore, position control for the electronic component responsive to a displacement between the placement position and the mounting position of the electronic component due to the self alignment effect of the molten solder can be fulfilled properly. Thus, the mounting quality of the electronic component can be improved while the self alignment effect of the molten solder is effectively utilized.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE INVENTION

Figure 1:
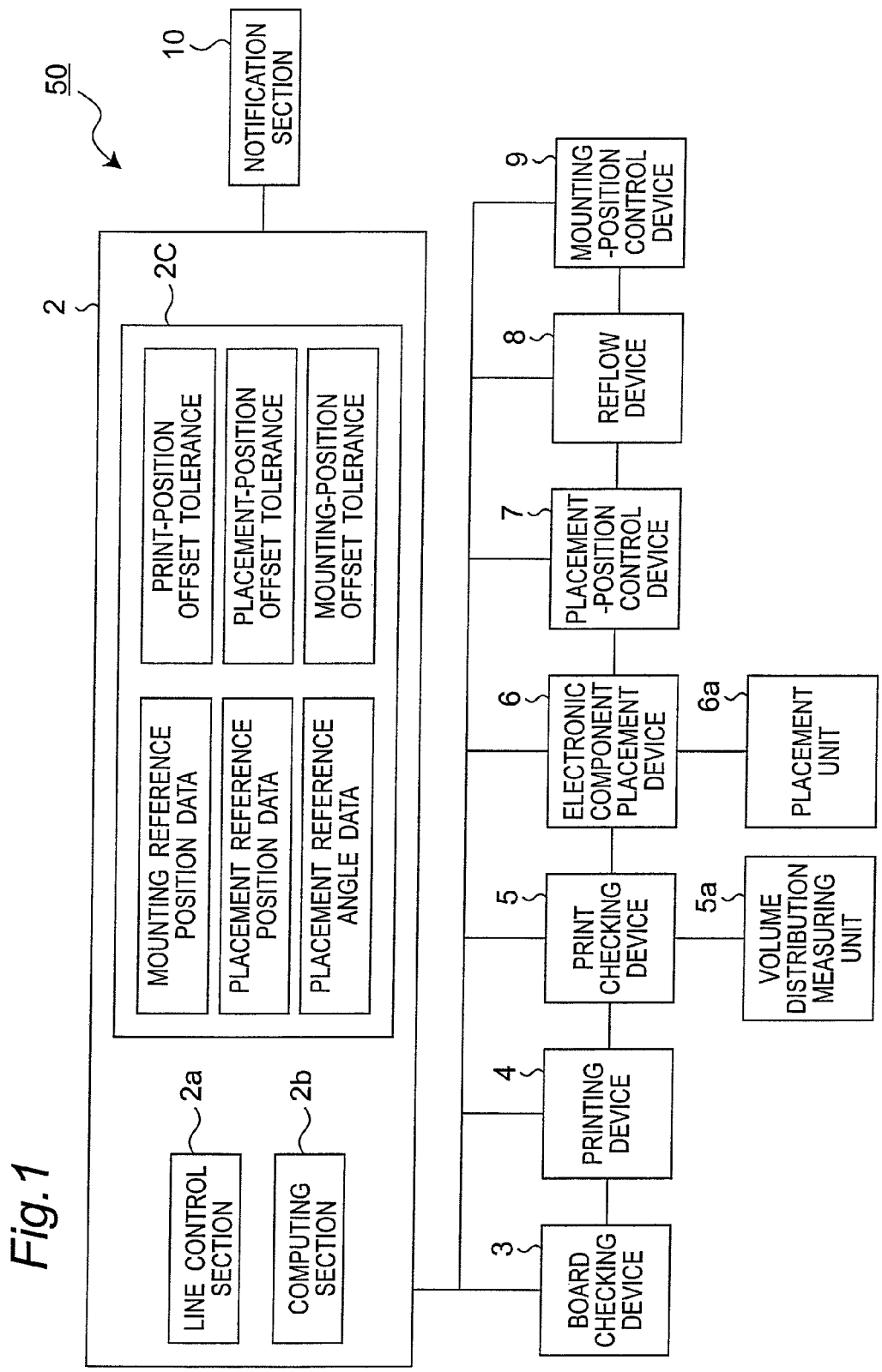
FIG. 1 is a configuration diagram of an electronic component mounting line according to an embodiment of the present invention.

Before the description of the present invention proceeds, it is to be noted that like parts are designated by like reference numerals throughout the accompanying drawings.

Hereinbelow, an embodiment of the present invention will be described in detail with reference to the accompanying drawings.

Figure 2A:
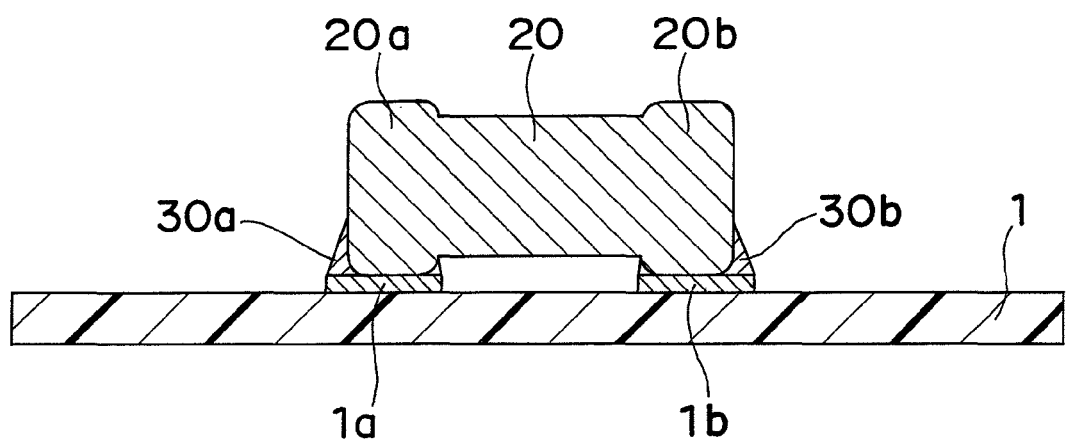
FIG. 2A is a side view showing a state that an electronic component is mounted on a board.
Figure 2B:
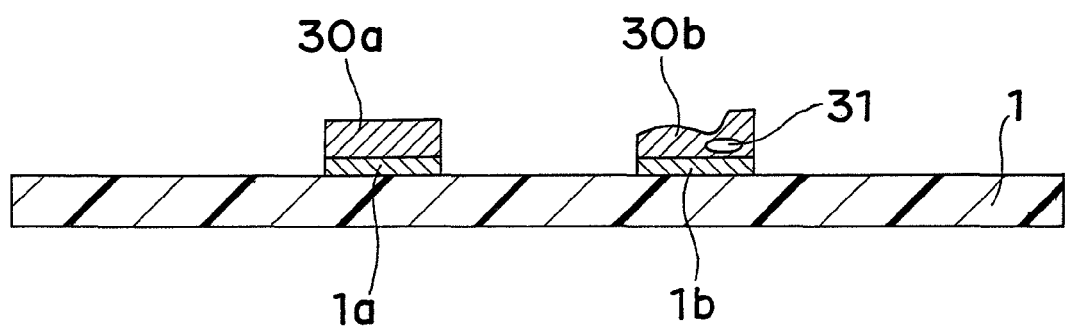
FIG. 2B is a side view showing a state that solder paste pieces are printed on board-side electrodes.
Figure 3A:
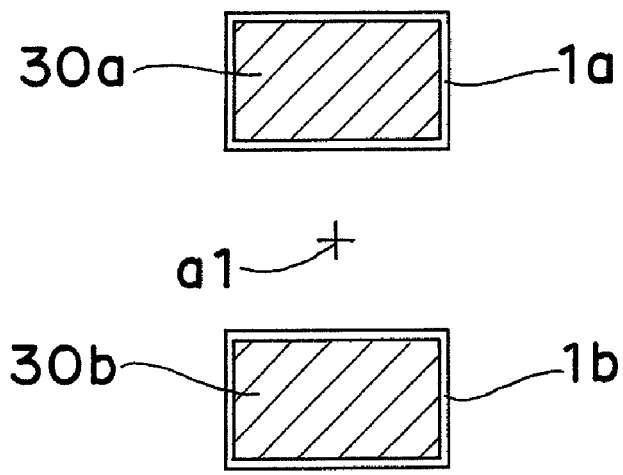
FIG. 3A is a plan view showing a state that solder paste pieces are printed in normal positions on the board-side electrodes.
Figure 3B:
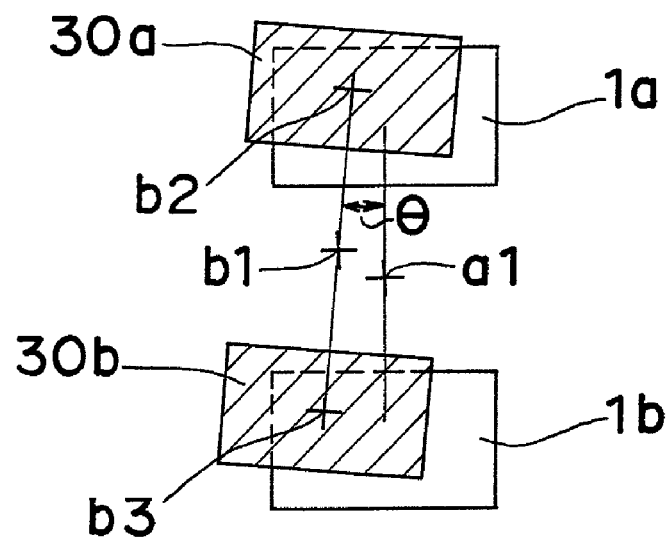
FIG. 3B is a plan view showing a state that solder paste pieces are printed in offset positions on the board-side electrodes.
Figure 3C:
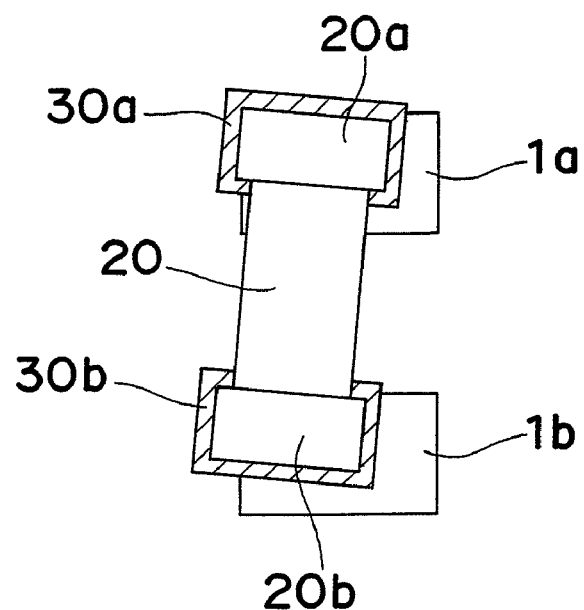
FIG. 3C is a plan view showing a state that an electronic component is placed on the board-side electrodes.
Figure 3D:
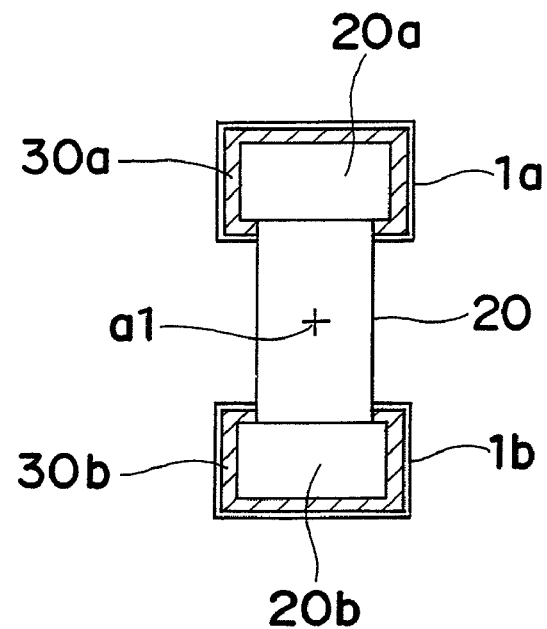
FIG. 3D is a plan view showing a state that an electronic component is mounted on board-side electrodes through reflow of the solder paste pieces.

FIG. 1 is a configuration diagram of an electronic component mounting line which is an example of the component-mounted board production apparatus according to an embodiment of the present invention. FIG. 2A is a side view showing a state that an electronic component is mounted on a board in the electronic component mounting line of the embodiment. FIG. 2B is a side view showing a state that solder paste pieces as an example of solder are printed on board-side electrodes. FIG. 3A is a plan view showing a state that solder paste pieces are printed in normal positions on the board-side electrodes. FIG. 3B is a plan view showing a state that solder paste pieces are printed in offset positions on the board-side electrodes. FIG. 3C is a plan view showing a state that an electronic component is placed on the board-side electrodes. FIG. 3D is a plan view showing a state that an electronic component is mounted on board-side electrodes through reflow of the solder paste pieces.

First of all, the electronic component mounting line of this embodiment of the invention is explained with reference to FIGS. 1, 2A, 2B, 3A, 3B, 3C and 3D. Referring to FIG. 1, an electronic-component-mounting production line 50 is so constructed that a plurality of devices for subjecting a board (circuit board) to specified processing are disposed sequentially, and processing operations in those devices are controlled by a line control section 2a included in an administrative computer 2. Also, the electronic-component-mounting production line 50 is an apparatus in which a plurality of devices for performing specified steps, respectively, are disposed sequentially, and which produces component-mounted boards with electronic components mounted thereon through the steps performed by those devices sequentially and administratively.

A board checking device 3 provided on the leftmost side of FIG. 1, which is the most upstream in the electronic-component-mounting production line 50, performs a status check of a board that is an object onto which an electronic component is to be mounted. The status check of a board is, for example, a check such as confirmation of board type or electrode formation position or the like.

A printing device 4 provided on the downstream side of the board checking device 3, i.e. on its right side in FIG. 1, is a device for printing solder paste pieces as an example of solder onto electrodes (board-side electrodes) formed on the board.

A print checking device 5 provided on the downstream side of the printing device 4 is a device for performing a check for print state including the print position of the solder paste pieces printed on electrodes of the board. In more detail, a check for displacement amount of the print position of the solder paste pieces with respect to electrode positions of the board is performed.

An electronic component placement device 6 provided on the downstream side of the print checking device 5 is a device for mounting an electronic component via solder paste pieces onto board electrodes with the solder paste printed thereon.

A placement-position control device 7 as an example of a placement-position decision device placed on the downstream side of the electronic component placement device 6 is a device for performing position control of an electronic component placed on the board electrodes.

A reflow device 8 as an example of a bonding device provided on the downstream side of the placement-position control device 7 is a device for melting the solder paste to bond an electrode of the electronic component and an electrode of the board to each other directly or via solder.

A mounting-position control device 9 as an example of a mounting-position decision device provided on the downstream side of the reflow device 8 is a device for performing position control of an electronic component mounted on the electrodes. In addition, between the individual devices constituting the electronic-component-mounting production line 50, board discharge mechanisms for discharging defective boards from the line 50 are provided so that a board which has been decided as defective in any device on an upstream side of the line 50 can be discharged from the line 50 without being transferred downstream.

Referring to FIG. 2A, component-side electrodes 20a, 20b provided on both sides of an electronic component are bonded to a pair of board-side electrodes 1a, 1b provided on a board 1 by solder paste pieces 30a, 30b, respectively. By such an arrangement as in this case that the board-side electrode 1a and the component-side electrode 20a as well as the board-side electrode 1b and the component-side electrode 20b, which are mutually opposing electrodes in each case, are bonded to each other, respectively, with high accuracy, an electrical bonding of them that is electrically and physically strong can be realized, so that a high product quality can be ensured in electronic-component mounted boards. Referring to FIG. 3A, a mounting reference positional is preparatorily set to a position corresponding to a generally center of the pair of board-side electrodes 1a, 1b, and the mounting reference positional serves as a "board-side electrode position" indicating positions of the pair of board-side electrodes 1a, 1b.

In the printing device 4, as shown in FIG. 3A, the solder paste pieces 30a, 30b are printed at such normal positions as not to overflow the board-side electrodes 1a, 1b. However, it can occur that, for example as shown in FIG. 3B, the solder paste pieces 30a, 30b are printed at positions offset with respect to the board-side electrodes 1a, 1b by influences of the fabrication accuracy of the board 1, printing accuracy or the like. If the solder paste pieces 30a, 30b are printed at normal positions, then it becomes achievable that the electronic component 20 is placed onto the pair of board-side electrodes 1a, 1b by referencing the mounting reference positional and then mounted with their opposing electrodes positioned with high accuracy through the subsequent reflowing. However, if the solder paste pieces 30a, 30b are not printed at normal positions, placing the electronic component 20 by referencing the mounting reference positional may result in a bonding failure. The bonding failure that tends to occur is, for example, that surface tension of the solder paste pieces 30a, 30b melting under reflowing acts on the electronic component 20, causing the electronic component 20 to be displaced from the mounting reference positional, which is the original placement position, or that strong surface tension acts partly on the electronic component 20, giving rise to a phenomenon that the electronic component 20 is erected.

Therefore, in the electronic component mounting line 50 of this embodiment, the placement of the electronic component 20 is performed not by referencing the mounting reference positional, which is the board-side electrode position, but by referencing the print position of the solder paste pieces 30a, 30b. With such placement implemented, while the solder paste pieces 30a, 30b melted under the reflowing are being wetted and spread on the surfaces of the board-side electrodes 1a, 1b, the surface tension properly acts on the board-side electrodes 1a, 1b and the component-side electrodes 20a, 20b, allowing the component-side electrodes 20a, 20b of the electronic component 20 to be moved toward central portions of the board-side electrodes 1a, 1b, respectively (self alignment effect). As a result, the electronic component 20 is bonded to the pair of board-side electrodes 1a, 1b in such a position-corrected state that the placement position of the electronic component 20 before the reflowing is corrected to near the mounting reference positional.

Referring to FIG. 3B, the print position of the solder paste pieces 30a, 30b, which serves as a reference for placement of the electronic component 20, is set to a planar position given by a center of volume b1 of the solder paste pieces 30a, 30b as an example. One of printing failures of the solder paste pieces 30a, 30b is nonuniformity in three-dimensional print amount shown in FIG. 2B in addition to the planar positional offset shown in FIG. 3B. Therefore, print amount of the solder paste pieces 30a, 30b is measured in volume and the planar position of their center of volume b1 is taken as the "mounting reference position" of the electronic component 20, thus making it possible to sufficiently fulfill the positional correction function by the self alignment effect.

The print checking device 5 includes a volume distribution measuring unit 5a for measuring the center of volume b1 of the solder paste pieces 30a, 30b. The volume distribution measuring unit 5a applies laser light to individual measuring points on the surfaces of the solder paste pieces 30a, 30b to measure heights of the individual measuring points from angles of reflection of the laser light reflected at the individual measuring points by application of the triangulation technique. Cumulating the above-measured heights of the individual measuring points along the board surface direction makes it possible to obtain three-dimensional shapes of the solder paste pieces 30a, 30b. In addition, it can occur that air mixed into the solder paste pieces 30a, 30b, or air involved in printing of the solder paste pieces 30a, 30b onto the board-side electrodes 1a, 1b, remains within the solder paste piece 30b, causing a void 31 to occur (see, e.g., FIG. 2B). In this case, since it is difficult to capture the presence of the void 31 with laser light, which would be reflected by the surface of the solder paste piece 30b. X-rays are applied to the individual measuring points of the solder paste piece 30b along its heightwise direction, where solder paste amounts in the heightwise direction at the individual measuring points are measured by concentration levels of a transmission image and the resulting solder paste amounts are cumulated along the board surface direction to calculate a volume distribution of solder paste. By measuring solder paste amounts in this way, a true volume distribution of solder paste in consideration of influences of a void can be obtained. It is noted that the volume distribution measuring unit 5a and a computing section 2b constitute a solder set-position measuring device in this embodiment.

The computing section 2b, which functions as a computing unit (computing means) for calculating the print position of solder paste pieces printed on the board-side electrodes, calculates center of volumes b2, b3 of the solder paste pieces 30a, 30b, respectively, from three-dimensional shapes or volume distributions of the solder paste pieces 30a, 30b measured by the above-described method with the volume distribution measuring unit 5a, and further calculates a center of volume b1 of the pair of solder paste pieces 30a, 30b as a whole. The computing section 2b functions also as a computing unit for calculating an offset angle θ of the print position of the solder paste pieces 30a, 30b from offset amounts of planar positions of the center of volumes b2, b3 with respect to the board-side electrodes 1a, 1b, respectively, as shown in FIG. 3B.

A storage section 2c has the mounting reference positional stored therein as mounting reference position data. Also, the center of volume b1 and the offset angle θ calculated by the computing section 2b are stored as placement reference position data and placement reference angle data, respectively. In addition, in the storage section 2c, a print-position offset tolerance which is a tolerance value for an offset amount of the print position of the solder paste pieces 30a, 30b with respect to the pair of board-side electrodes 1a, 1b has preparatorily been stored. If a positional offset amount is within the tolerance, it is decided that a position correction by self alignment is practicable, followed by a move to an electronic component placement step. On the other hand, if the positional offset amount is over the tolerance, then it is decided that the position correction by self alignment is impracticable, where the board 1 is discharged without being transferred downstream while an operator is notified of an error alarm from a notification section 10.

The electronic component placement device 6, which includes a placement unit 6a for placing an electronic component onto board-side electrodes by referencing the print position of solder paste pieces, places the electronic component 20 onto the pair of board-side electrodes 1a, 1b according to the placement reference position data and the placement reference angle data stored in the storage section 2c as shown in FIG. 3C.

The placement-position control device 7, which functions as a placement-position control means for performing control of the placement position of an electronic component by referencing the print position of solder paste pieces, performs position control of the electronic component 20 mounted on the pair of board-side electrodes 1a, 1b according to the placement reference position data and the placement reference angle data stored in the storage section 2c. In the storage section 2c, a placement-position offset tolerance which is a tolerance value for a placement-position offset amount of the electronic component 20 placed on the pair of board-side electrodes 1a, 1b with respect to the print position of the solder paste pieces 30a, 30b has preparatorily been stored. If a positional offset amount is within the tolerance, it is decided that the electronic component 20 has been placed at the print position of the solder paste pieces 30a, 30b, followed by a move to a reflowing step. On the other hand, if the positional offset amount is over the tolerance, the board 1 is discharged without being transferred downstream while the operator is notified of an error alarm from the notification section 10.

The reflow device 8 functions as a bonding unit for heating and melting the solder paste pieces 30a, 30b to make the component-side electrodes 20a, 20b of the electronic component 20 and the board-side electrodes 1a, 1b to each other, respectively. In the electronic component 20 in the placement state shown in FIG. 3C, the solder paste pieces 30a, 30b are heated and melted by the reflow device 8, so that the mounting position of the electronic component 20 is displaced by the self alignment effect of molten solder so as to become closer to the mounting reference positional as shown in FIG. 3D, thus the bonding, i.e. mounting, of the electronic component 20 being accomplished.

The mounting-position control device 9, which functions as a mounting-position control means for controlling the mounting position of an electronic component by referencing a board-side electrode position, performs position control of the electronic component 20 mounted on the pair of board-side electrodes 1a, 1b according to the mounting reference position data stored in the storage section 2c. In the storage section 2c, a mounting-position offset tolerance which is a tolerance value for a mounting-position offset amount of the electronic component 20 mounted on the pair of board-side electrodes 1a, 1b with respect to the mounting reference positional has preparatorily been stored. If a positional offset amount is within the tolerance, it is decided that the electronic component 20 has been properly bonded to the pair of board-side electrodes 1a, 1b in a state of being position-corrected to near the mounting reference position al by the self alignment effect exerted by the molten solder paste pieces 30a, 30b. On the other hand, if the positional offset amount is over the tolerance, then it is decided that the electronic component 20 has not been properly bonded to the pair of board-side electrodes 1a, 1b, where the board 1 is discharged without being transferred downstream while the operator is notified of an error alarm from the notification section 10.

Figure 4:
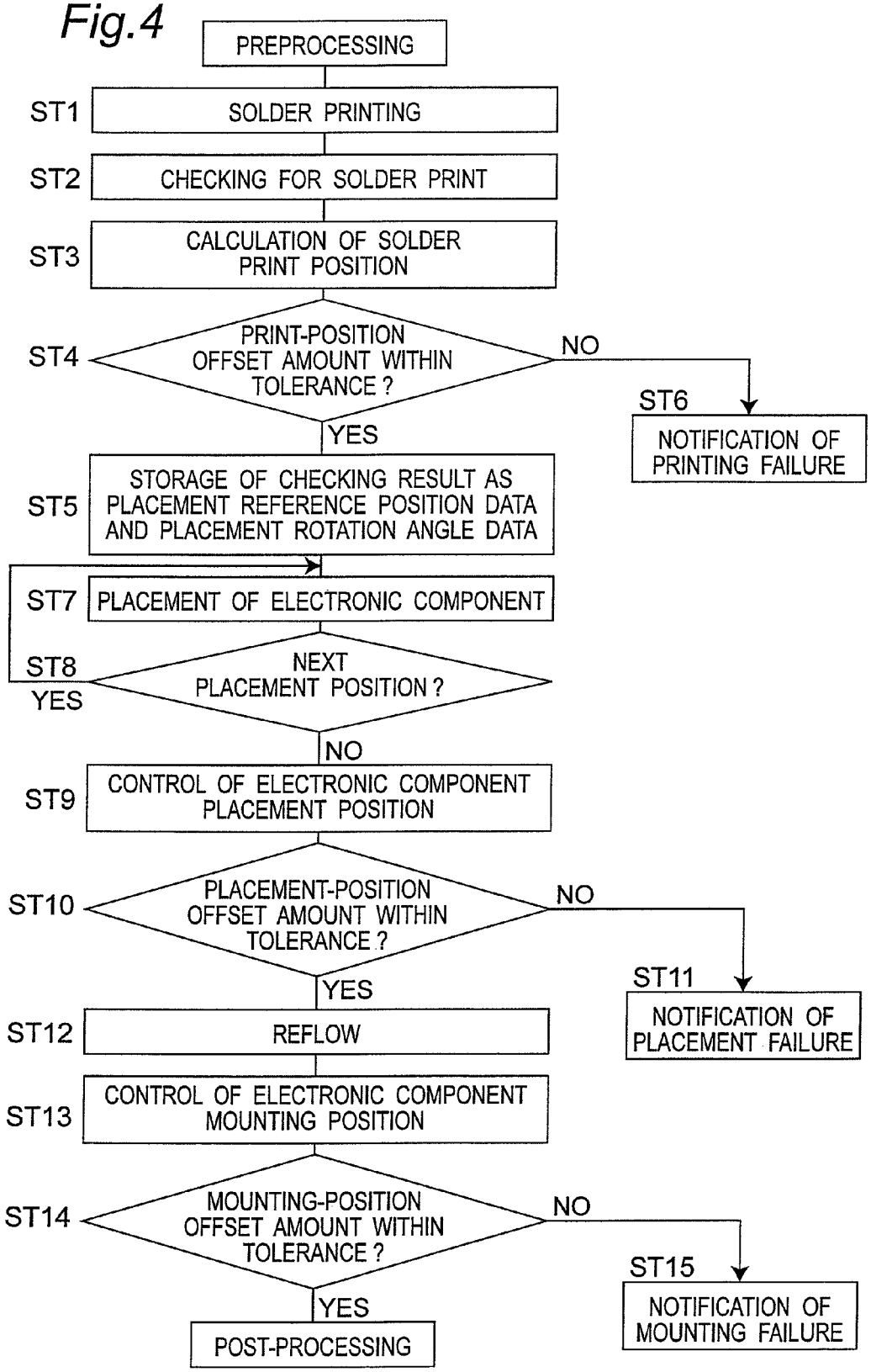
FIG. 4 is a position control flowchart for an electronic component mounting line in the embodiment of the invention.

Next, a mounting-position control method for electronic components in the electronic component mounting line 50 of this embodiment is explained with reference to with reference to the configuration diagram of the electronic component mounting line of FIG. 1 and the position control flowchart of FIG. 4.

First, solder paste pieces are printed on board-side electrodes provided on a board that has been transferred from the preprocessing step (step ST1), and a check for print state of the solder paste pieces is performed (step ST2). In this checking, a print position of the solder paste pieces printed on the board-side electrodes is calculated (step ST3). A print-state offset amount of the print position of the solder paste pieces with respect to the board-side electrode position is compared with an offset amount tolerance (step ST4). Then, if a print-position offset amount is within the tolerance, the print position of the solder paste pieces is stored as placement reference position data and placement reference angle data (step ST5), followed by a move to the succeeding step. On the other hand, if the print-position offset amount is over the tolerance, then it is decided that the print position is nonconforming, followed by a notification of an error alarm (step ST6). In the succeeding step, the electronic component is placed on the board-side electrodes according to the placement reference position data and the placement reference angle data (step ST7). In this case, if a plurality of board-side electrodes are provided on the board, a checking result on print state for every board-side electrode is stored as placement reference position data and placement reference angle data, and the electronic component is placed onto all the board-side electrodes according to their corresponding data, respectively (step ST8).

When the electronic component has been placed onto all the board-side electrodes, placement position control for the electronic component is performed by referencing the print position of the solder paste pieces (step ST9). A placement-position offset amount of the electronic component with respect to the print position of the solder paste pieces is compared with the placement-position offset tolerance (step ST10), where if the placement-position offset amount is within the tolerance, the step is followed by a move to the succeeding step, and if the placement-position offset amount is over the tolerance, then it is decided that the placement position is nonconforming, followed by a notification of an error alarm (step ST11). In the succeeding step, the electronic component is heated by reflowing, so that the solder paste pieces are melted to bond the electronic component and the board-side electrodes to each other (step ST12). After the reflowing, the electronic component is subjected to mounting-position control by referencing the board-side electrode position (step ST13). A mounting-position offset amount of the electronic component with respect to the board-side electrode position is compared with the mounting-position offset tolerance (step ST14), where if the mounting-position offset amount is within the tolerance, the step is followed by a move to the succeeding step, and if the mounting-position offset amount is over the tolerance, then it is decided that the mounting position of the electronic component is nonconforming, followed by a notification of an error alarm (step ST15). In this way, the individual steps in the electronic component mounting line 50 are carried out.

As shown above, in the electronic component mounting line of this embodiment, two different reference positions, i.e. a placement reference position for controlling the placement position of an electronic component before reflowing and a mounting reference position for controlling the mounting position of the electronic component after the reflowing, are set, and position control is performed based on the respective reference positions. That is, the control of the placement position of the electronic component before the reflowing is performed by referencing the print position of the solder paste, and the control of the mounting position of the electronic component after the reflowing is performed by referencing the board-side electrode position. By doing such position control, before reflowing, alignment between the solder paste pieces 30a, 30b and the electrodes 20a, 20b of the electronic component 20, respectively, can securely be achieved, so that the self alignment effect of the molten solder under the reflowing can effectively be obtained. Further, after the reflowing, i.e., after the obtainment of such a self alignment effect, it is implementable to check and see if the electrodes 20a, 20b of the electronic component 20 are securely bonded to the board-side electrodes 1a, 1b, respectively. Accordingly, the mounting quality can be improved while the self alignment effect is effectively utilized. Further, an optimum position control can be fulfilled at each stage in the electronic component mounting line, so that an improvement of yield as well as an improvement of product quality can be achieved by discharging defective boards in a more upstream side.

The foregoing embodiment has been described on a case where solder paste is used as the solder as an example. However, any solder material, other than solder paste, that is melted by the reflow step to exert the self alignment effect can also be adopted. Furthermore, the method for supplying the solder material onto the board-side electrodes is not limited to printing or application, and transfer or other methods may also be used.

It is to be noted that, by properly combining the arbitrary embodiments of the aforementioned various embodiments, the effects possessed by them can be produced.

According to the present invention, the placement position of the electronic component placed on the board-side electrodes is controlled by referencing the print position of solder paste pieces printed on the board-side electrodes, and the mounting position of the electronic component bonded to the board-side electrodes is controlled by referencing the board-side electrode position. Thus, the invention has an advantage that position control ready for displacements of the electronic component by virtue of the self alignment effect exerted by the solder paste melted under reflowing can be implemented, providing usefulness in fields involving the mounting of electronic components onto the board having solder paste applied thereon.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The disclosure of Japanese Patent Application No. 2006-251066 filed on Sep. 15, 2006 including specification, drawing and claims are incorporated herein by reference in its entirety.

The invention claimed is:

1. A position control method for electronic components in a component-mounted board production apparatus for sequentially performing a plurality of processes by which an electronic component having a plurality of component-side electrodes is mounted via solder onto a board having a plurality of board-side electrodes, said method comprising:

measuring a set position of the solder supplied onto the plurality of board-side electrodes using a volume distribution measuring unit and a computing section, wherein the volume distribution measuring unit measures a volume distribution of the solder along a heightwise direction and the computing section calculates a center of volume of the solder based on the measured volume distribution and further calculates an offset angle of a print position of the solder from an offset amount of a planar position of the center of the volume of the solder with respect to the board-side electrodes;

placing the electronic component onto the plurality of board-side electrodes by referencing the measured set position of the solder;

comparing a placement offset value of the placed position of the electronic component with respect to the measured set position of the solder with a placement offset tolerance and then determining whether the placement offset value is within the placement offset tolerance or not, the placement offset tolerance being a tolerance value for a placement-position offset amount of the electronic component placed on the boardside electrodes with respect to the measured set position of the solder;

when the board has been determined to have a placement offset value that is within the placement offset tolerance, melting the solder to bond the component-side electrodes of the electronic component and the board-side electrodes of the board to each other so that the electronic component is mounted on the board; and comparing a mounting offset value of a mounted position of the electronic component with respect to the board-side electrode position with a mounting offset tolerance and then determining whether the mounting offset value is within the mounting offset tolerance or not.

2. The position control method for electronic components in the component-mounted board production apparatus as defined in claim 1, wherein when the board has been determined to have a placement offset value that is not within the placement offset tolerance, the board is removed from the component-mounted board production apparatus without being subjected to succeeding processes.

* * * * *